United States Patent [19]

Fukushima et al.

[11] Patent Number: 5,034,359
[45] Date of Patent: Jul. 23, 1991

[54] INSULATING COMPOSITION

[75] Inventors: Noburu Fukushima, Tokyo; Shunji Nomura, Yokohama; Hisashi Yoshino, Machida; Ken Ando, Yokohama; Hiromi Niu, Tokyo; Tomohisa Yamashita, Yamato, all of Japan

[73] Assignee: Kabushiki Kaisha Toshiba, Kanagawa, Japan

[21] Appl. No.: 335,024

[22] Filed: Apr. 7, 1989

[30] Foreign Application Priority Data

Apr. 8, 1988 [JP] Japan ................................. 63-86730
Apr. 25, 1988 [JP] Japan ................................. 63-100281

[51] Int. Cl.$^5$ ........................................... C04B 35/50
[52] U.S. Cl. .................................. 501/123; 501/152; 501/126
[58] Field of Search ........................ 501/152, 123, 126

[56] References Cited

PUBLICATIONS

Subramanian et al., "Superconducting and nonsuperconducting analogs of bismuth strontium calcium copper oxide," J. Solid State Chem., 80(1), 156–160, early 1989.

Subramanian et al., "Superconductor-to insulator transition in the bismuth strontium yttrium copper oxide," J. Solid State Chem., 77(1), 196–199, early 1988.

Tamagai et al., "Characterization of a Non-Superconducting Cuprate, Bi2Sr2YCu2O8.5," Japanese Journal of Applied Physics, vol. 27, No. 6, pp. L1074–L1076, Jun. 1988.

Fukushima et al., "Transition to an Insulator from a Superconductor due to Substitution of Ca by Rare-earth Elements in Bi4Sr4RE2CUY4O16+0 (RE=Nd, Eu, Y)," Japanese Journal of Applied Physics, vol. 27, No. 5, pp. L790–L791, May 1988.

Fukushima et al., "Electrical and Magnetic Properties in Bi2Sr2Ca1-x YxCU2O8+0," Japanese Journal of Applied Physics, vol. 27, No. 8, pp. L1432–L1434, Aug. 1988.

Primary Examiner—William R. Dixon, Jr.
Assistant Examiner—C. Melissa Bonner
Attorney, Agent, or Firm—Finnegan, Henderson, Farabow, Garrett and Dunner

[57] ABSTRACT

An insulating composition consisting of Bi, Sr, RE, Cu, O or of Tl, Ba, RE, Cu, O (wherein; RE is an element selected from a group consisting of Nd, Sm, Eu, Gd, Tb, Dy, Ho, Er, Tm, Yb, Lu and Y) aligns properly with a crystal face of an oxide superconductor because its crystal structure is the same as or similar to that of the oxide superconductor. An insulating composition in which a part of Bi is replaced by Pb is further near the oxide superconductor its construction, and the modulation structure in this insulating composition is mitigated or disappears.

9 Claims, 3 Drawing Sheets

FIG. I

INSULATING COMPOSITION

BACKGROUND OF THE INVENTION

1. Field of the Invention

The present invention relates to an insulating composition used in a superconductive element.

2. Description of the Related Art

Recently, various experiments on oxide superconductors have been performed by many research groups since a laminate state perovskite type oxide of Ba-La-Cu-O series was represented to be possible to have a nature of high critical temperature (Z. Phys. B Condensed Matter 64, 189–193 (1986)). Particularly, a defect-perovskite type oxide super conductor having oxygen defects represented by Y-Ba-Cu-O series has been confirmed to have a high critical temperature of 90K or more which is a higher level than liquid nitrogen (Phys. Rev. Lett. Vol. 58, No. 9, 908–910).

Further, in 1988, a superconductive oxide of Bi-Sr-Ca-Cu-O series having a high critical temperature of 105K was discovered (NIHON KEIZAI SHINBUN dated Jan. 22, 1988, etc.).

The superconductive oxide of Bi-Sr-Ca-Cu-O series is an excellent oxide superconductive material as compared with a superconductive oxide of Ba-La-Cu-O series or of Y-Ba-Cu-O series because it does not necessitate the use of rare-earth elements of high cost and has high chemical stability against moisture as well as a high critical temperature.

Now, the superconductive elements using the tunnel effect have been advanced to apply to digital devices such as logical elements, memory elements, etc. in computers because of their high speed operation and their low power consumption. Further, 4-bits multiplier, 3K gate array, etc. employing Nb/Aloxide/Nb junction, NbN/MgO/NbN junction, etc. have been manufactured in trials. Moreover, superconductive 3-terminal elements as superconductor - semiconductor elements have been manufactured in trials. However, all these elements are composed of superconductors of low critical temperature and liquid helium is used as a cooling medium. Therefore, they are not practical yet in problems of development of peripheral technology economic, etc.

Consequently, applications of an oxide superconductor having a high critical temperature to the above mentioned superconductive elements have been discussed.

However, in the case of making the above mentioned superconductive elements by oxide superconductor and insulating composition, a problem remains that electron levels are newly produced at the crystal interface between the oxide superconductive layer and the insulating composition, and electrons are trapped because of the poor alignment nature thereof, thereby injuring functions as a Josephson element. Therefore, predetermined characteristics are hardly obtained.

Moreover, $Bi_2Sr_2Ca_2Cu_3O_{10}$ having the transition temperature of in the vicinity of 110K and $Bi_2Sr_2Ca_1Cu_2O_8$ having the transition temperature of in the vicinity of 80K have been known as Bi series superconductors. However, a problem remains a synthesis of $Bi_2Sr_2Ca_2Cu_3O_{10}$ having higher critical temperature is not easy. The reason is considered that the problem is based on a modulation structure existing in the b crystal axis direction of the Bi series superconductor or internal stresses which cause the modulation structure.

SUMMARY OF THE INVENTION

It is one object of the present invention to provide an insulating composition which is stable and does not react with the crystal interface of the oxide superconductor during a heat treatment at high temperature.

It is another object of the present invention to provide an insulating composition which has a good alignment with the crystal interface of the oxide superconductor.

It is further object of the present invention to provide an insulating composition in which the modulation structure is mitigated or disappears.

According to the present invention, there is provided an insulating composition replacing Ca by RE; wherein, the Ca is a component of a superconductor composition consisting of Bi, Sr, Ca, Cu and O or of Tl, Ba, Ca, Cu and O, and the RE is an element selected from a group consisting of Nd, Sm, Eu, Gd, Tb, Dy, Ho, Er, Tm, Yb, Lu and Y.

Now, a small amount of Ca may remain.

Here, the atomic ratio of Bi, Sr, RE, Cu and O or of Tl, Ba, RE, Cu and 0 is $2:X:Y:Z:8+\delta$. In principle, $2:X:Y:Z:8+\delta$ is $2:2:1:2:8+\delta$. ($\delta$:oxygen defect) such as $2:X:Y:Z$ may be allowable:

wherein; $1.5 \leq X \leq 2.5$ $0.5 \leq Y \leq 1.5$ $1.8 \leq Z \leq 2.5$

Further, in the insulating composition of the present invention, a part of Bi may be replaced by Pb.

Here, the amount of replacement of Bi by Pb is preferably 1.5 or less because a value of more than 1.5 renders the crystal structure different. Further, a value ranging from 0.2 to 1.0 is more preferable.

The insulating composition of the present invention may be employed as an insulating material of an insulating layer, substrate, etc. of the superconductive devices.

A case in which the insulating composition of the present invention is used in the insulating layer of the superconductive element will be explained.

The insulating composition can be made by mixing carbonate oxide and organic acid salt, etc. of Bi, Sr, RE, Cu, etc. in the stoichiometric ratio, and sintering it at a temperature ranging from 800° C. to 900° C.

Now, the combination ratio of raw materials is not necessary in the strict stoichiometric ratio, and about 10% difference is allowable. Moreover, the reaction temperature can be reduced by adding a minute amount of alkali metal compound.

For example, a Josephson element of tunnelling junction type can be obtained by laminating in sequence an oxide superconductive layer, an insulating layer and an oxide superconductive layer on a substrate through a physical deposition method such as vacuum evaporation method, magnetron sputtering method, ion beam sputter method, cluster ion beam method and molecular beam epitaxy method, or a chemical vapour deposition method such as CVD method and plasma CVD method.

Further, the oxide superconductor and the insulating composition can be formed through a multi-evaporation method or a multi-sputter method using every metal elements constituting them as evaporation sources or sputtering sources. When the oxide superconductor consists of Bi, Sr, Ca, Cu and O and the insulating layer consists of Bi, Sr, RE, Cu and O, the workability becomes good because the change of forming the oxide superconductive layer and forming the insulating layer can be conducted by replacing only one element.

Preferably, the thickness of the oxide superconductive layer is 100 Å or more so that it represents superconductor characteristics and the thickness of the insulating layer ranges from 50 Å to 200 Å so that it does not disturb the tunnel effect.

Further, after forming respective the material layers, a heat treatment may be conducted at a temperature of 400° to 600° C. under oxygen atmosphere, if necessary, so that the superconductor characteristics are enhanced by introducing oxygen into oxygen defects of the oxide superconductor.

By the same manner, a superconductive 3-terminal element, a high sensitive magnetic sensor, etc. may be formed.

When the insulating composition of the present invention is used as a substrate of the superconductive element, the monocrystalline substrate is grown by conventional flux method, FZ (Floating Zone) method or kiln-process method.

The monocrystalline substrate containing Bi, Sr, RE, Cu, O in an atomic ratio of $2:X:Y:Z:8+\delta$, $$1.5 \leq X \leq 2.5$$
$$0.5 \leq Y \leq 1.5$$
$$1.8 \leq Z \leq 2.5$$

$\delta$: oxygen defect is formed by the self-flux method. $Bi_2O_3$ and $CuO$ may be contained simultaneously as the flux. In this case, it may satisfy a following formula in mol ratio ($\beta$, $\gamma$, $\epsilon$) of the composition of respective positive ions;

$$\beta Bi_2O_3 + \gamma\{(Sr.RE)O\} + \epsilon CuO$$

wherein; $5 \leq \beta \leq 25$
$20 \leq \gamma \leq 60$
$10 \leq \epsilon \leq 60$ The mixture is melted in a crucible, and cooled to produce a monocrystalline structure having a composition of $Bi_2Sr_XRE_YCu_ZO_{8+\delta}$.

Next, actions and effects of the present invention will be explained.

The insulating composition of the present invention has a lattice structure the same as or similar to that of the oxide superconductor, and the lattice constant is also extremely similar. Therefore, the alignment at the interface can be good and the deterioration of the characteristic by electron trapping can be suppressed.

Particularly, when the insulating composition is used as a substrate, because of identical or similar crystal structures to each other, a monocrystalline thin film of oxide super conductor can be epitaxially grown on the substrate.

Further, the insulating composition of the present invention is stable at a heat treatment of high temperature and does not react with the lattice face of the oxide superconductor.

Therefore, by employing a superconductive element made of the insulating composition of the present invention as an insulating material, IC, transistor, high sensitive magnetic sensor, etc. of super high speed operation and low power consumption can be manufactured.

Furthermore, the insulating composition of the present invention can be further near its lattice constant to that of Bi series superconductor if a part of Bi is replaced by Pb. Moreover, the modulation structure of the insulating composition according to the present invention can be mitigated or disappear.

When Bi series superconductive thin film is grown on the monocrystalline of the insulating composition according to the present invention, $Bi_2Sr_2Ca_2Cu_3O_{10}$ layer having a high critical temperature can be easily obtained. The reason is considered that the modulation structure is mitigated or disappears in the insulating composition of the present invention, and in the superconductive thin film also the modulation structure is mitigated and disappears.

Further, in the superconductive thin film thus obtained, a superconductive transition in a sharp figure can be obtained by the same reason, and therefore, increasing of a critical current at 77K was confirmed.

That is, by using the insulating composition of the present invention in a superconductive element as an insulating material, a good superconductive element representing a sharp transition at 110K can be easily obtained.

Although the explanation was concerned with Bi series, Tl series also represents the same crystal structure, action and effect as the Bi series, as a matter of course.

DESCRIPTION OF THE PREFERRED EMBODIMENTS

Hereinafter embodiments of the present invention will be explained.

EXAMPLE 1

Figure 1:
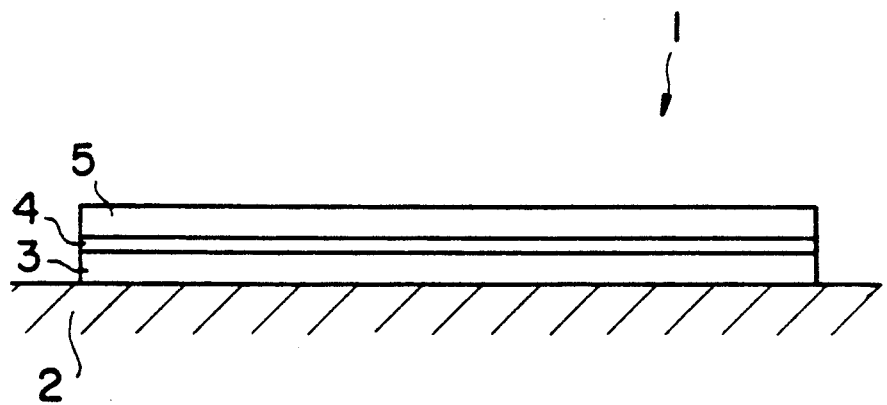
FIG. 1 is a cross sectional view showing an oxide superconductive element using an insulating composition of the present invention as an insulating layer.

FIG. 1 is a cross-sectional view showing an oxide superconductive element of tunnel junction type using an insulating composition of the present invention as an insulating layer, and in the drawing, the oxide superconductive element 1 is formed on the substrate 2 and is constituted by laminating $Bi_2Sr_2Cu_2O_{8+\delta 2O\delta}$ layer 3, $Bi_2Sr_2Y_1Cu_2O_{8+\delta}$ layer 4 and $Bi_2Sr_2Cu_2O_{8+\delta}$ layer 5 in sequence.

Method of Manufacturing $Bi_2Sr_2Ca_1Cu_2O_\delta$ Target

At first, $Bi_2O_3$ powder of 33.5 mol %, $SrCO_3$ powder of 33.5 mol %, $CaCO_3$ powder of 33.5 mol % and CuO powder of 16.7 mol % are mixed in a monopot with zirconia balls and subject to wet grinding, and after drying for removing water, a heat treatment for pre-sintering (850° C. to 900° C., 24 hours) is conducted. Thereafter, a wet grinding is conducted again in a monopot, and after drying for removing water, powders (super conductor) of 5 μm or less in grain size are obtained.

Next, a granulation material is adjusted by adding polyvinylalcohol to the raw powders mentioned above, and a disc of 154 mm diameter and 6.5 mm thickness is formed through process steps of filling the granulation material into a metal mold and forming under 1000 Kg/cm$^2$.

Next, by sintering it under oxygen atmosphere at 840° C. during 24 hours, a target material of oxide superconductor having 98% sintering density and represented by $Bi_2Sr_2Ca_1Cu_2O_{8+\delta}$ is obtained.

Method of Manufacturing $Bi_2Sr_2Y_1Cu_2O_{8+\delta}$ Target

A disc represented by $Bi_2Sr_2Y_2Cu_2O_{8+\delta}$ and having 154 mm diameter, 6.5 mm thickness and sintering density of 98% is obtained by the same method as the above mentioned method except replacing the $CaCO_3$ powders mentioned above by $Y_2O_3$ powders.

Method of Manufacturing an Oxide Superconductive Element (Josephson Element)

$Bi_2Sr_2Ca_1Cu_2O_{8+\delta}$ layer having 1.0 μm thickness is formed on a $SrTiO_3$ substrate of $10 \times 10 \times 1$ mm shape while maintaining the substrate temperature at 700° C. through RF magnetron sputtering method under 7 Pa pressure of mixture gas consisting of argon of 95 mol % and oxygen of 5 mol % by using $Bi_2Sr_2Ca_1Cu_2O_{8+\delta\delta}$ target.

Next, a $Bi_2Sr_2Y_2Cu_2O_{8+\delta\delta}$ having 10 Å thickness is formed on the $Bi_2Sr_2Y_2Cu_2O_{8+\delta}$ layer by using a $Bi_2Sr_2Ca_1Cu_2O_{8+\delta}$ target.

Finally, a $Bi_2Sr_2Ca_1Cu_2O_{8+\delta}$ layer having 1.0 μm thickness is formed on the $Bi_2Sr_2Y_2Cu_2O_{8+\delta}$ layer by the same conditions as above mentioned conditions, thereby obtaining an oxide superconductive element of tunnel junction type.

The oxide superconductive element thus constructed has the critical temperature of 77K and was confirmed to flow the current through respective layers by tunnel effect at the temperature.

An oxide superconductive element is formed by the same manner as mentioned above except forming a $Tl_2Ba_2Y_1Cu_2O_{8+\delta}$ layer as the insulating layer using a $Tl_2Ba_2Y_1Cu_2O_{8+\delta}O_\delta$ target and a $Tl_2Ba_2Ca_1Cu_2O_{8+\delta}$ layer as the super conductor using a $Tl^2Ba_2Cu_2O_{8+\delta}$ target, and it was confirmed to operate at the critical temperature of 100K.

EXAMPLE 2

The same oxide superconductor element as Example 1 except forming $Bi_2Sr_2Ca_1Cu_3O_{8+\delta}$ layer in place of $Bi_2Sr_2Ca_1Cu_2O_{8+\delta}$ layer 3, 5 by using $Bi_2Sr_2Ca_2Cu_3O_8$ target in place of $Bi_2Sr_2Ca_1Cu_2O_{8+\delta}$ target was manufactured.

A current was confirmed to flow through respective layers by tunnel effect at the critical temperature of 70K of the oxide suppreconductor element.

COMPARISON EXAMPLE 1

An oxide superconductive element having the same structure as Example 1 except, in place of $Bi_2Sr_2Y_1Cu_2O_{8+\delta}$ layer 4 in Example 1, forming an $Al_2O_3$ layer of the same thickness was manufactured. However, the element did not operate at the critical temperature of 77K.

Although, in the above mentioned examples, an example using an nonconductive oxide consisting of $Bi_2Sr_2Y_1Cu_2O_8$ as an insulating layer was explained, the same effect can be obtained in a case that an oxide in which Y in the formula mentioned above is replaced by Nd, Sm, Cd, Tb, Dy, Ho, Er, Tm, Yb or Lu is used because the construction has the same crystal structure.

EXAMPLE 3

A monocrystalline $Bi_2Sr_2Y_iCu_2O_{8+\delta}$ of $20\ mm \times 20\ mm \times 2$ mm configuration is produced by a method including the steps of weighing raw powders of $Bi_2O_3$, $SrCO_3$, $Y_2O_3$, CuO by a balance of 100 g weighing so that the atomic ratio of Bi:Sr:Y:Cu is 3:2:1:3, mixing them, putting them in an alumina crucible, keeping them at 1150° C. for 24 hours under atmosphere, thereafter cooling gradually to 800° C. by taking 100 hours, and cooling to room temperature. The specimen was confirmed to be monocrystalline and to have (001) facets by an X-ray diffraction method.

An oxide superconductive monocrystalline film having an aligned direction with the substrate was obtained by $Bi_2Sr_2CaCu_2O_{8+\delta}$ film formed on this substrate mentioned above through an RF sputter method keeping the substrate temperature at 550° C. The reaction between the substrate and the film was within measuring limit when the section of the film was analyzed by EPMA.

Figure 2:
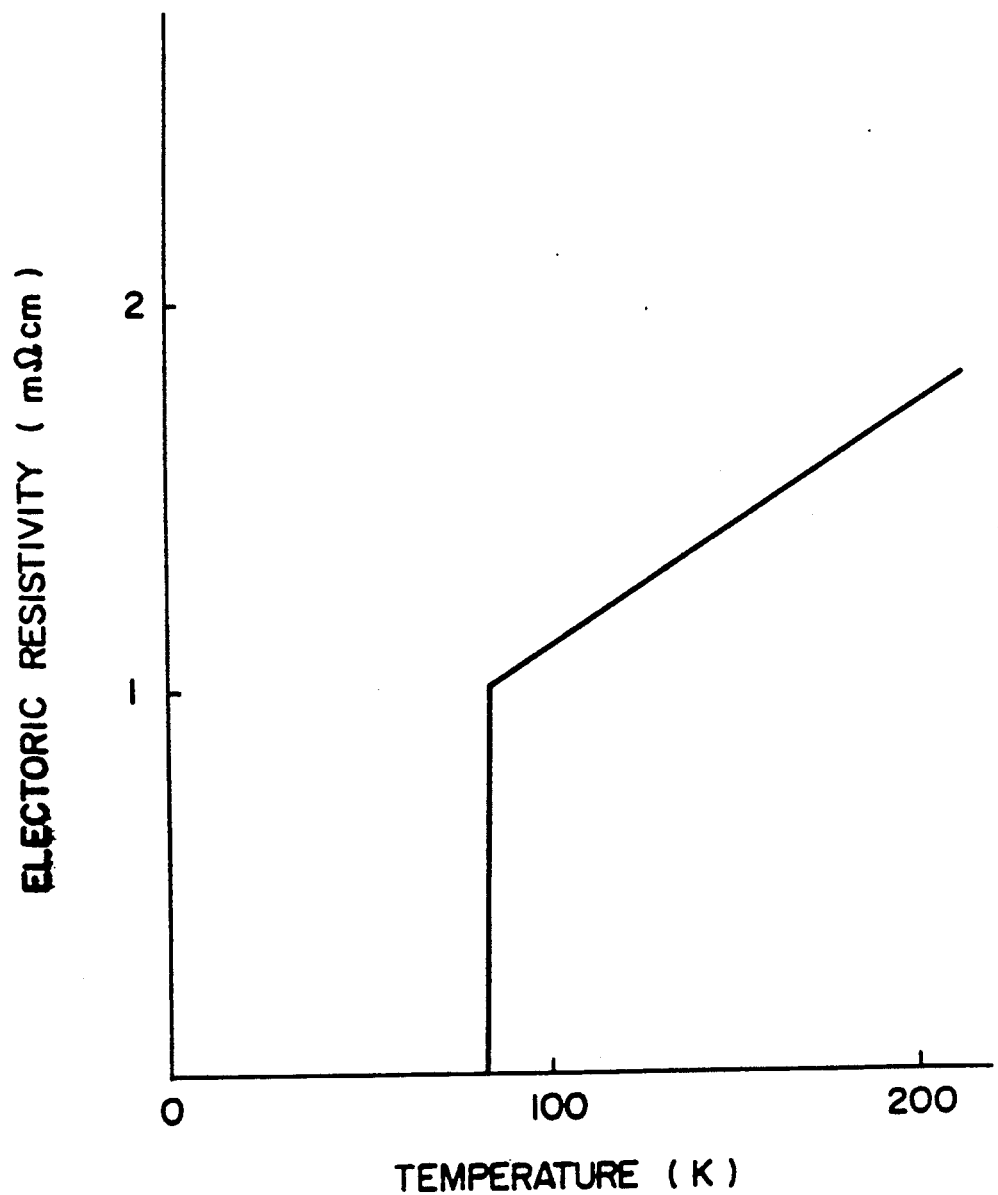
FIG. 2 is a diagram showing electronic resistivity characteristics with respect to every temperature, in a monocrystalline oxide superconductive thin film grown on a monocrystalline substrate according to the present invention.

FIG. 2 shows temperature characteristics of electric resistivity. Excellent superconductivity characteristics were obtained such as Tc=84K, and $\Delta Tc \div 1K$.

COMPARISON EXAMPLE 2

A film was formed by the same conditions as in the Example 3 except using a MgO monocrystalline as the substrate. The film was of C face oriented, however, it was a polycrystalline having the orientation degree of about 70% and having large concavities and convexities at its surface, and MgO ions were detected within the film by EPMA analysis on the film section. EXAMPLE 4

A monocrystalline of $Bi_2Sr_2Nd_2Cu_3O_{10+\delta}$ having 10 $mm \times 10$ mm $\times 1$ mm size was formed by weighting Bi, Sr, Nd, Cu to 4:2:2:5 in the atomic ratio in this order and growing monocrystalline in the same manner as in Example 3, and it was confirmed to be monocrystalline and to have (001) facets by an X-ray diffraction method. When $Bi_2Sr_2Ca_2Cu_3O_{10+\delta}$ film was formed on the substrate by a cluster ion beam method at a substrate temperature of 450° C., an oxide superconductive monocrystalline film aligning its direction with the substrate was obtained.

EXAMPLE 5

Each powders of $Bi_2O_3$, PbO, $SrCO_3$ $Y_2O_3$ and CuO were weighed so that the atomic ratio of Bi:Pb:Sr:Y:Cu was 1:1:2:1:2. Further, $Bi_2O_3$ and CuO were added to the above mixture so that the atomic ratio was 1:1, and the resulting mixture was well mixed.

Next, the mixture was put in an alumina crucible, heated to 1150° C. under atmosphere, melted uniformly by keeping it at this temperature, thereafter cooled gradually to 800° C. by taking 100 hours during 24 hours and then cooled to room temperature.

The large monocrystalline of 10 mm×20 mm×2 mm was formed in the obtained cooled solid material By a X-ray diffraction method, this monocrystalline was found to be $BiPbSr_2Y_1Cu_2O_{8+\delta}$ ($\delta$ denotes oxygen defect) and of C face oriented to monocrystalline face. As the electric resistivity was $10^4\Omega\cdot cm$ at $-100°$ C., it was found to be able to use an insulating material.

On the substrate of the aboved $BiPbSr_2Y_1Cu_2O_{8+\delta}$ monocrystalline, Bi series oxide superconductor film having 200 Å thickness was formed through multi-sputtering method of RF magnetrom sputtering under 7 Pa pressure of mixture gas consisting of argon of 95 mol % and oxygen of 5 mol % by using $Bi_2O_3$, $SrCO_3$, $CaCO_3$ and CuO as sputtering target. The electric power for each sputtering target was controlled so that the compositon of the formed film was Bi:Sr:Ca:Cu=2:2:2:3.

By the X-ray diffraction method, the obtained Bi series oxide superconductor film was found to be an epitaxially grown film aligning its direction with the substrate.

Further, on the above Bi series oxide superconductor film formed on the insulating monocrystalline substrate, $BiPbSr_2Y_1Cu_2O_{8+\delta}$ film having thickness 50 Å was formed through multi-sputtering method of RF magnetron sputtering by using $Bi_2O_3$, PbO, $SrCO_3$, $Y_2O_3$ and CuO as the sputtering target. Thereafter, on the obtained film, Bi series oxide $Bi_2Sr_2Ca_2Cu_3O_{10+\delta}$ superconductor film having thickness 200 Å was formed in the above manner to manufacture a Josephson element. The element represented the superconductive characteristics at the transition temperature of 110K and a good Josephson effect.

COMPARISON EXAMPLE 3

A Josephson element was manufactured by using $SrTiO_3$ as the substrate, and by laminating $Bi_2Sr_2Ca_2Cu_3O_{10+\delta}$ superconductor of 200 Å, MgO of 50 Å as the insulating layer and $Bi_2Sr_2Ca_2Cu_3O_{10+\delta}$ superconductor of 200 Å in sequence on the substrate.

However, a superconductive characteristic was not represented at this state. Therefore, a heat treatment was conducted for improving the crystal condition, and then, the superconductive characteristics were estimated. As a result, the superconductive state was represented at the transition temperature of 60K, but a good Josephson characteristic was not obtained.

EXAMPLE 6

As the manufacturing method showed in Example 5, monocrystalline of $Bi_{2-w}Pb_wSr_2YCu_2O_{8+\delta}$ was obtained.

Figure 3:
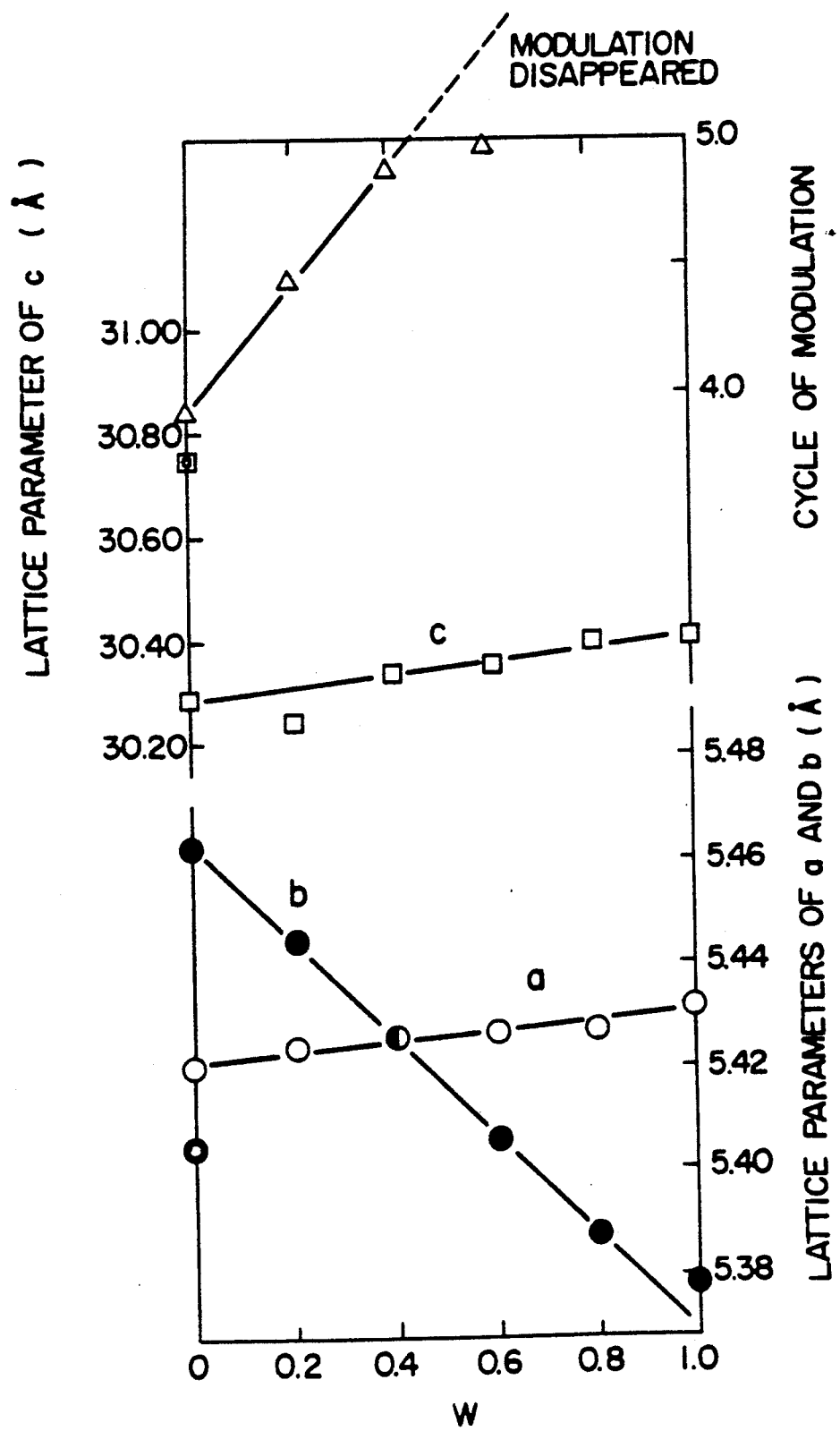
FIG. 3 is a diagram showing characteristics of an insulating composition according to the present invention in the case of replacing a part of Bi by Pb.

FIG. 3 shows lattice constants in $Bi_{2-w}Pb_wSr_2YCu_2O_{8+\delta}$ crystal and $Bi_2Sr_2CaCu_2O_{8+\delta}$ superconductor, and modulation structure in $Bi_{2-w}Pb_wSr_2YCu_2O_{8+\delta}$ crystal.

In the drawing, the horizontal axis denotes W. That is, with increasing W, the ratio of replacing Bi by Pb is increased. The vertical axis at left-upper side denotes the lattice constant of c axis, and the vertical axis at the right-lower side denotes the lattice constants of a and b axis. The vertical axis at right-upper side denotes the modulation structure.

○ signs denote lattice constant at the a axis in $Bi_{2-w}Pb_wSr_2YCu_2O_{8+\delta}$ crystal; signs denote lattice constant at b axis; and □ signs denote the lattice constant at c axis.

◎ sings denote lattice constants at a axis and b axis in $Bi_2Sr_2CaCu_2O_{8+\delta}$ and signs denote lattice constant at c axis.

Δ signs denote modulation structure in $Bi_2Sr_2CaCu_2O_{8+\delta}$ crystal.

It can be recognized that, in $Bi_{2-w}Pb_wSr_2YCu_2O_{8+\delta}$ crystal, the lattice constant at the b axis is nearest $Bi_2Sr_2CaCu_2O_{8+\delta}$ in case of replacing about 30% of Bi by Pb, and c axis is nearest $Bi_2Sr_2CaCu_2O_{8+\delta}$ in case of increasing the replacement ratio of Bi by Pb.

Further, when the replacement of Bi with Pb is increased, the modulation structure disappears.

EXAMPLES 7 TO 16

Insulative monocrystallines were manufactured through flux methods in accordance to compositions shown in table 1 and table 2.

TABLE 1

| Example | $Bi_2O_3$ mol % | $SrCO_3$ mol % | $Y_2O_3$ mol % | CuO mol % | cooling speed | size of monocrystalline (mm³) |
|---|---|---|---|---|---|---|
| 7 | 20.00 | 16.67 | 6.67 | 35.00 | 10° C./h | 10 × 15 × 2 |
| 8 | 15.00 | 26.67 | 6.67 | 30.00 | 30° C./h | 14 × 20 × 2 |
| 9 | 15.00 | 26.67 | 6.67 | 30.00 | 10° C./h | 18 × 20 × 2 |
| 10 | 15.00 | 26.67 | 6.67 | 30.00 | 1° C./h | 18 × 20 × 2 |
| 11 | 22.50 | 26.67 | 6.67 | 15.00 | 10° C./h | 14 × 18 × 2 |
| 12 | 7.50 | 36.67 | 9.17 | 30.00 | 10° C./h | 10 × 15 × 2 |
| 13 | 7.50 | 20.00 | 5.00 | 55.00 | 10° C./h | 10 × 14 × 2 |

TABLE 2

| Example | $Bi_2O_3$ mol % | $SrCO_3$ mol % | $Nd_2O_3$ mol % | CuO mol % | cooling speed | size of monocrystalline (mm³) |
|---|---|---|---|---|---|---|
| 14 | 15.00 | 26.67 | 6.67 | 30.00 | 30° C./h | 10 × 15 × 1 |
| 15 | 15.00 | 26.67 | 6.67 | 30.00 | 10° C./h | 12 × 15 × 1 |
| 16 | 15.00 | 26.67 | 6.67 | 30.00 | 1° C./h | 12 × 14 × 1 |

What is claimed is:

1. An insulating composition consisting essentially of Bi, Sr, Ca, Cu and O or of Tl, Ba, Ca, Cu and O wherein Ca, is replaced by RE wherein RE is an element selected from a group consisting of Nd, Sm, Eu, Gd, Tb, Dy, Ho, Er, Tm, Ym, Yb, Lu and Y.

2. The insulating composition of claim 1, characterized in that the atomic ratio of Bi, Sr, RE, Cu and O or of Tl, Ba, RE, Cu and O is $2:X:Y:Z_{8+\delta}$ wherein: $1.5 \leq X \leq 2.5$ $0.5 \leq Y \leq 1.5$ $1.8 \leq Z \leq 2.5.$ 3. A method of forming an insulating composition including Bi, Sr, RE, Cu and O by the atomic ratio of $2:X:Y:Z:8+\delta$ wherein: $1.5 \leq X \leq 2.5$ $0.5 \leq Y \leq 1.5$ $1.8 \leq Z \leq 2.5$ $\delta$: oxygen defect, wherein RE is an element selected from the group consisting of Nd, Sm, Eu, Gd, Tb, Dy, Ho, Er, Tm, Ym, Yb, Lu and Y, said method comprising the steps of preparing a mixture of raw powders including $Bi_2O_3$, $SrCO_3$, $RE_2O_3$, CuO with the atomic ratio of Bi:Si:RE:Cu is 3:2:1:3, placing said mixture in a crucible, maintaining said mixture for about 24 hours at a temperature of about 1150 degrees C. at atmospheric pressure to achieve melting, lowering the temperature gradually to about 800 degrees C. within about 100 hours and cooling to room temperature.

4. A method of forming an insulating composition including Bi, Sr, RE, Cu, O by the atomic ratio of $2:X:Y:Z:8+\delta$ wherein: $1.5 \leq X \leq 2.5$
$0.5 \leq Y \leq 1.5$
$1.8 \leq Z \leq 2.5$ $\delta$: oxygen defect wherein, RE is an element selected from the group consisting of Nd, Sm, Eu, Gd, Tb, Dy, Ho, Er, Tm, Ym, Yb, Lu and Y, said method comprising the steps of preparing a mixture for melting, said mixture consisting essentially of $Bi_2O_3$, SrO, RE0, and CuO in a mol ratio in accordance with the formula;

$\beta\ Bi_2O_3 + \partial((Sr - RE)O) + \epsilon CuO$, wherein; $5 \leq \beta \leq 25$
$20 \leq \partial \leq 60$
$10 \leq \epsilon \leq 60$ melting the mixture in a crucible, and lowering the temperature of the mixture to produce a monocrystalline structure having a composition of $Bi_2Sr_x RE_yCu_zO_{8+\delta}$.

5. An insulating composition of claim 1 characterized in that a part of Bi is replaced by Pb.

6. An insulating composition of claim 5 characterized in that the atomic ratio of Bi, Pb, Sr, RE, Cu, O is $2-W:W:2:1:2:8+\delta$, wherein: $O < W \leq 1.5$ $\delta$ is oxygen defect.

7. An insulating composition of claim 6 characterized in that W is represented by:

$0.2 \leq W \leq 1.0$.

8. An insulating composition of claim 5 characterized in that the atomic ratio of Bi, Pb, Sr, RE, Cu, O is $2-W:W:2:2:3:10+\delta$, wherein: $O < W \leq 1.5$ $\delta$ is oxygen defect.

9. An insulating composition of claim 8 characterized in that W is represented by:

$0.2 \leq W \leq 1.0$.

* * * * *

UNITED STATES PATENT AND TRADEMARK OFFICE
CERTIFICATE OF CORRECTION

PATENT NO. : 5,034,359
DATED : July 23, 1991
INVENTOR(S) : Noburu Fukshima et al.

It is certified that error appears in the above-identified patent and that said Letters Patent is hereby corrected as shown below:

Claim 2, column 8, line 46, after "Z" insert --:--, and below line 51, insert the following new line
 --$\delta$ oxygen defect--.

Claim 4, column 9, line 22, (final line in column, corresponds to "35), change "$\partial$" to --$\gamma$--;
Column 10, line 2, change "$\partial$" to --$\gamma$--.

Signed and Sealed this

Twenty-seventh Day of April, 1993

Attest:

MICHAEL K. KIRK

Attesting Officer

Acting Commissioner of Patents and Trademarks